US012760813B2

(12) United States Patent
Nakamura et al.

(10) Patent No.: US 12,760,813 B2
(45) Date of Patent: Oct. 13, 2026

(54) VALVE DEVICE

(71) Applicant: FUJIKIN INCORPORATED, Osaka (JP)

(72) Inventors: Nobuo Nakamura, Osaka (JP); Tatsuhiko Sato, Osaka (JP); Tomohiro Nakata, Osaka (JP); Kengo Tsujino, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 154 days.

(21) Appl. No.: 18/718,595

(22) PCT Filed: Feb. 6, 2023

(86) PCT No.: PCT/JP2023/003725

§ 371 (c)(1),
(2) Date: Nov. 5, 2024

(87) PCT Pub. No.: WO2023/188822

PCT Pub. Date: Oct. 5, 2023

(65) Prior Publication Data

US 2025/0060049 A1 Feb. 20, 2025

(30) Foreign Application Priority Data

Mar. 30, 2022 (JP) ................................ 2022-055276

(51) Int. Cl.
*F16K 31/122* (2006.01)
*F16K 31/42* (2006.01)
*H10P 72/00* (2026.01)

(52) U.S. Cl.
CPC ........ *F16K 31/1226* (2013.01); *F16K 31/423* (2013.01); *H10P 72/0402* (2026.01)

(58) Field of Classification Search
CPC .. F16K 31/1226; F16K 31/423; F16K 31/122; F16K 31/1221; F16K 31/1225; F16K 31/363
See application file for complete search history.

(56) References Cited

U.S. PATENT DOCUMENTS 2,634,754 A * 4/1953 Rahn .................... F16K 31/363 251/44
3,734,455 A * 5/1973 Natho ................ F16K 31/1221 92/128

(Continued)

FOREIGN PATENT DOCUMENTS

JP 2003-162333 A 6/2003
JP 2007-064333 A 3/2007

(Continued)

OTHER PUBLICATIONS

International Search Report issued in International Patent Application No. PCT/JP2023/003725, dated Apr. 25, 2023, along with an English translation thereof.

*Primary Examiner* — Eric Keasel
(74) *Attorney, Agent, or Firm* — Greenblum & Bernstein, P.L.C.

(57) ABSTRACT

A valve device includes: a valve body defining a flow path; a diaphragm as a valve element for opening and closing the flow path; a stem for making the diaphragm separate and seat on a valve seat; a coil spring as a spring member for constantly biasing the stem in a valve-closing direction; a piston connected to the stem; and an actuator body for slidably accommodating the piston, wherein the inside of the actuator body is partitioned by the piston into a pressure chamber to which a driving gas is supplied and an atmospheric chamber communicating with the atmosphere via vent holes formed in the actuator body, and the actuator body includes an adjustment mechanism capable of restrict- (Continued)

ing the ventilation amounts of the vent holes so as to adjust a valve closing time required for valve closing and a valve opening time required for valve opening to be equal.

9 Claims, 8 Drawing Sheets

(56) References Cited

U.S. PATENT DOCUMENTS

| | | | | |
|---|---|---|---|---|
| 4,973,025 | A * | 11/1990 | Iqbal ........................ | F16K 21/10 251/48 |
| 8,256,744 | B2 * | 9/2012 | Tanikawa ............ | F16K 31/1225 251/368 |
| 2010/0090151 | A1 | 4/2010 | Tanikawa et al. | |
| 2017/0234438 | A1 | 8/2017 | Tanikawa et al. | |

FOREIGN PATENT DOCUMENTS

| | | | |
|---|---|---|---|
| JP | 2010-025171 | A | 2/2010 |
| JP | 2016-121776 | A | 7/2016 |
| JP | 2020-041565 | A | 3/2020 |
| JP | 2020-122207 | A | 8/2020 |

* cited by examiner

【fig.1】
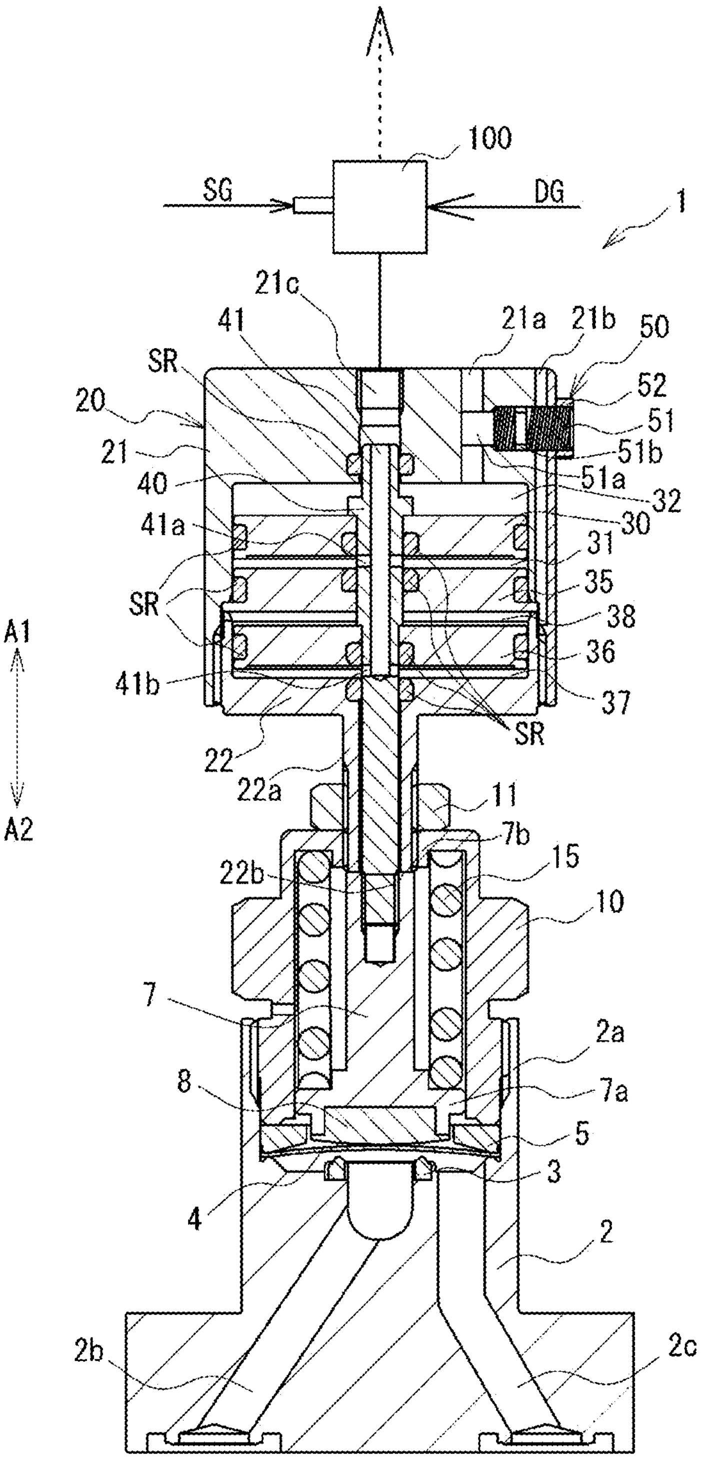

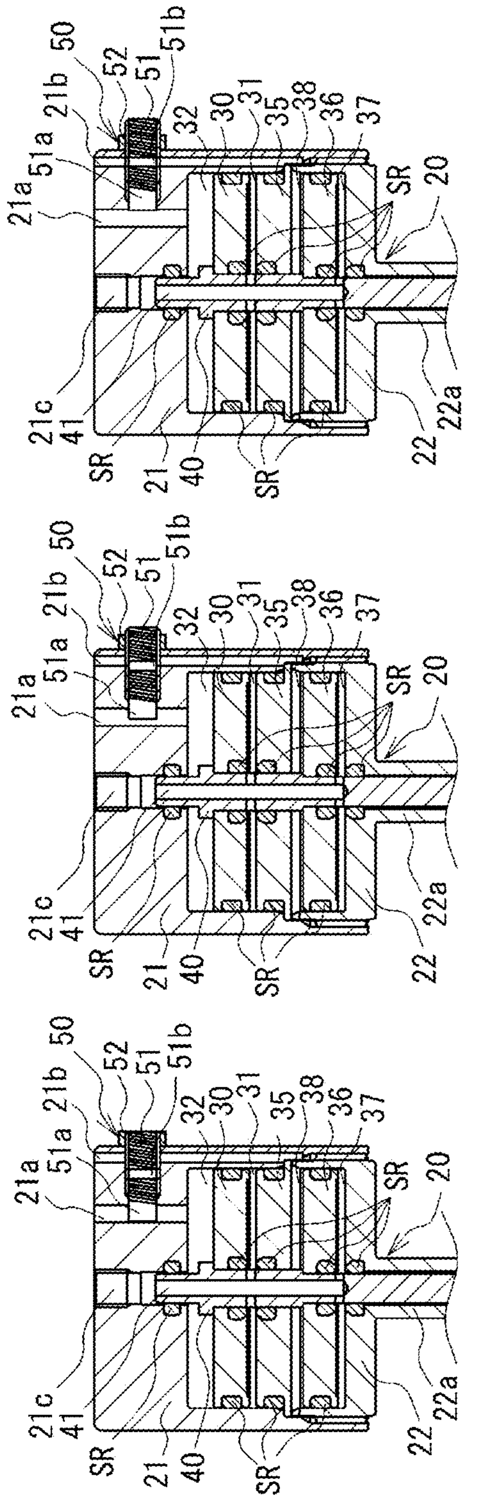
(c)
(b)
(a)
【fig.2】

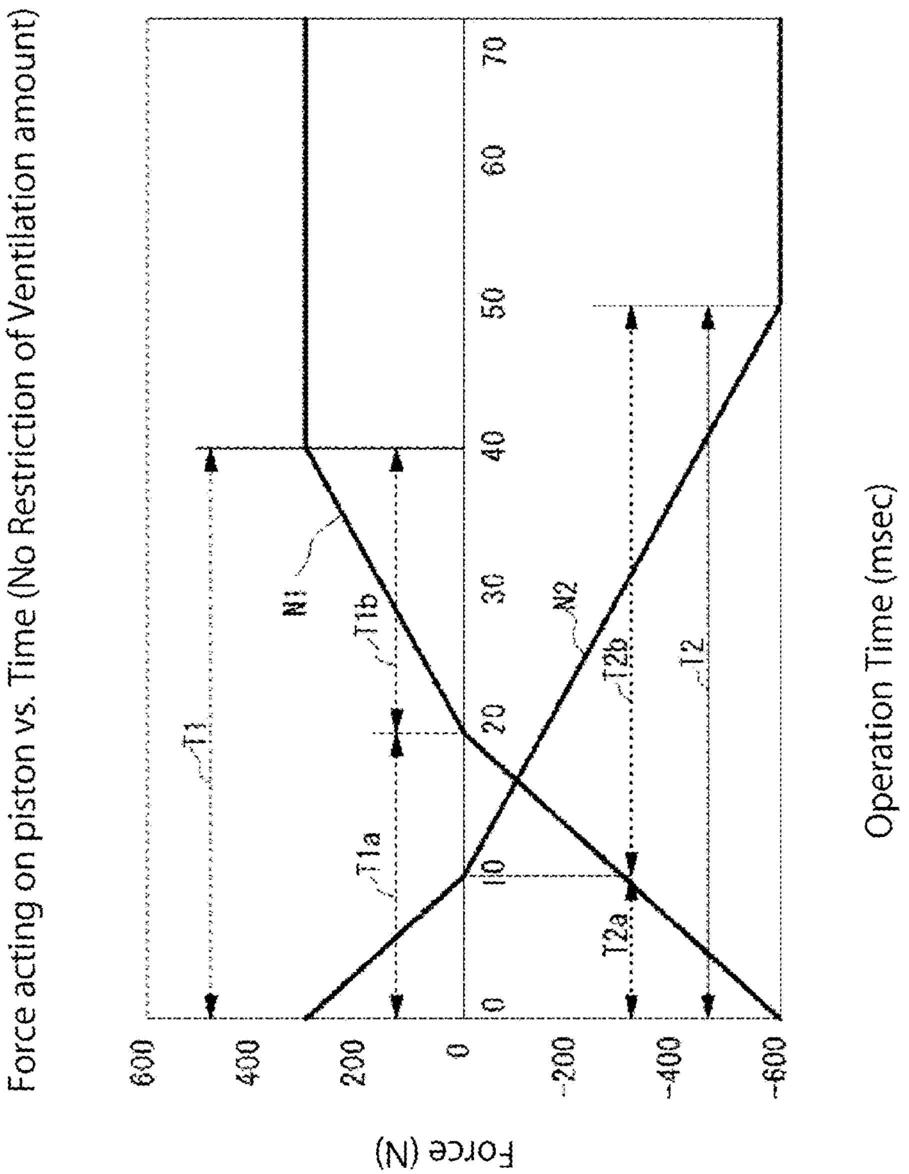
[fig. 3]

[fig.4]
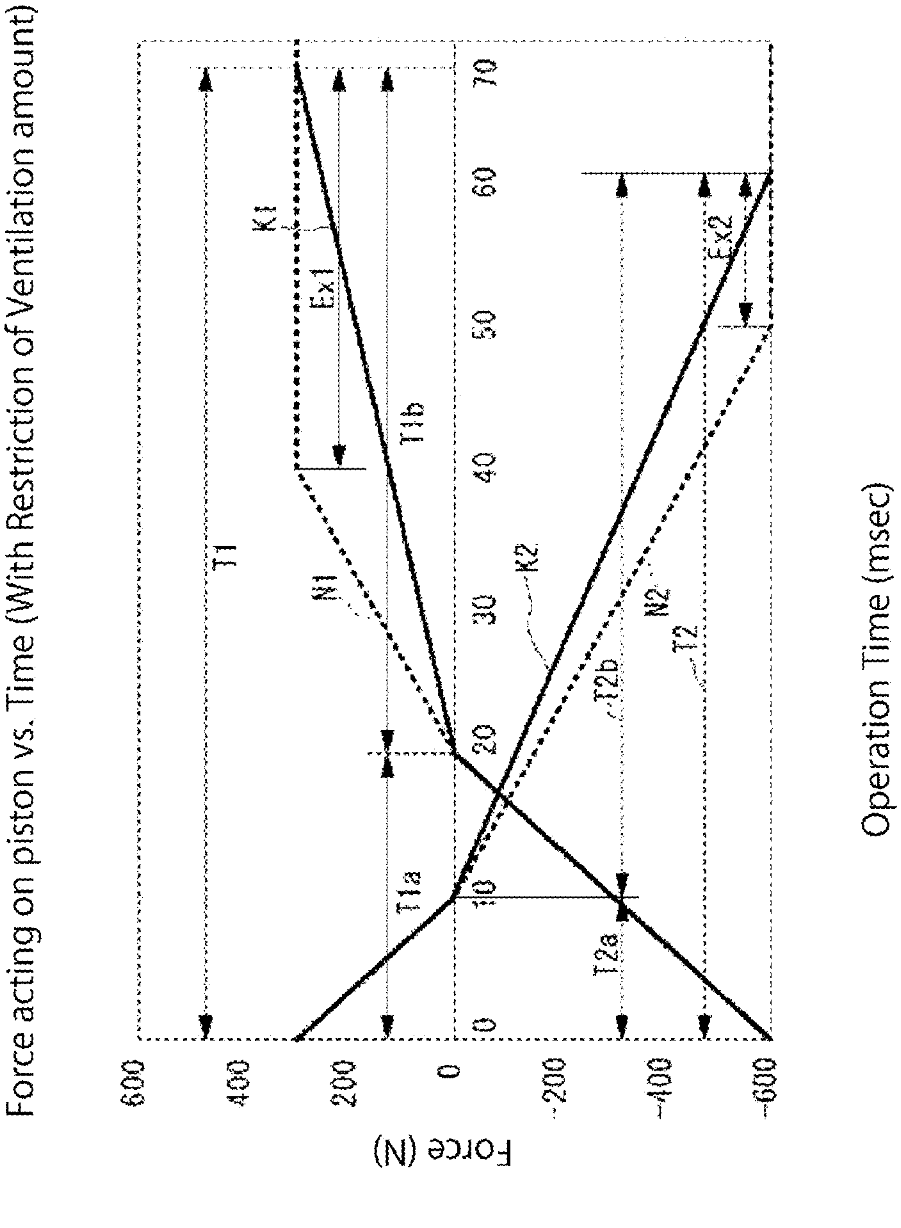

[fig.5]
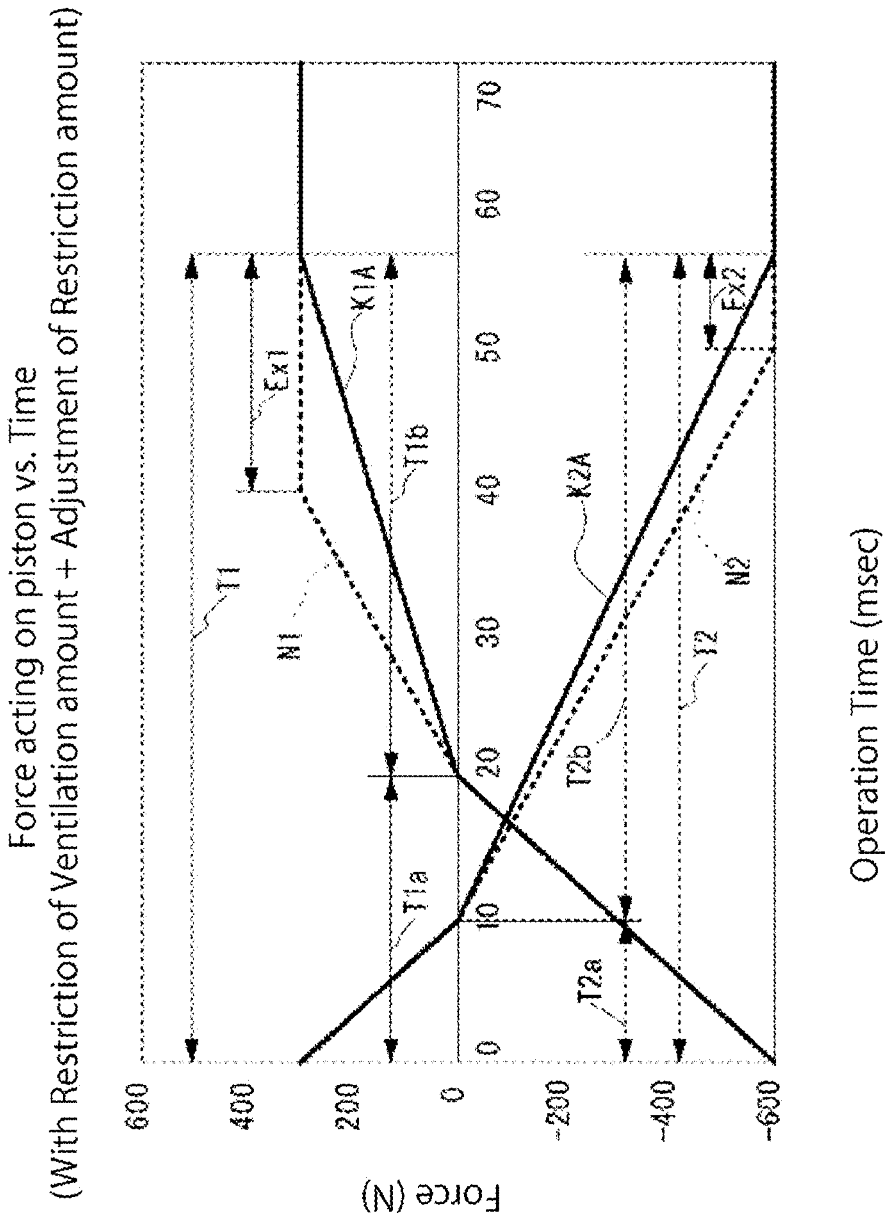

[fig.6]
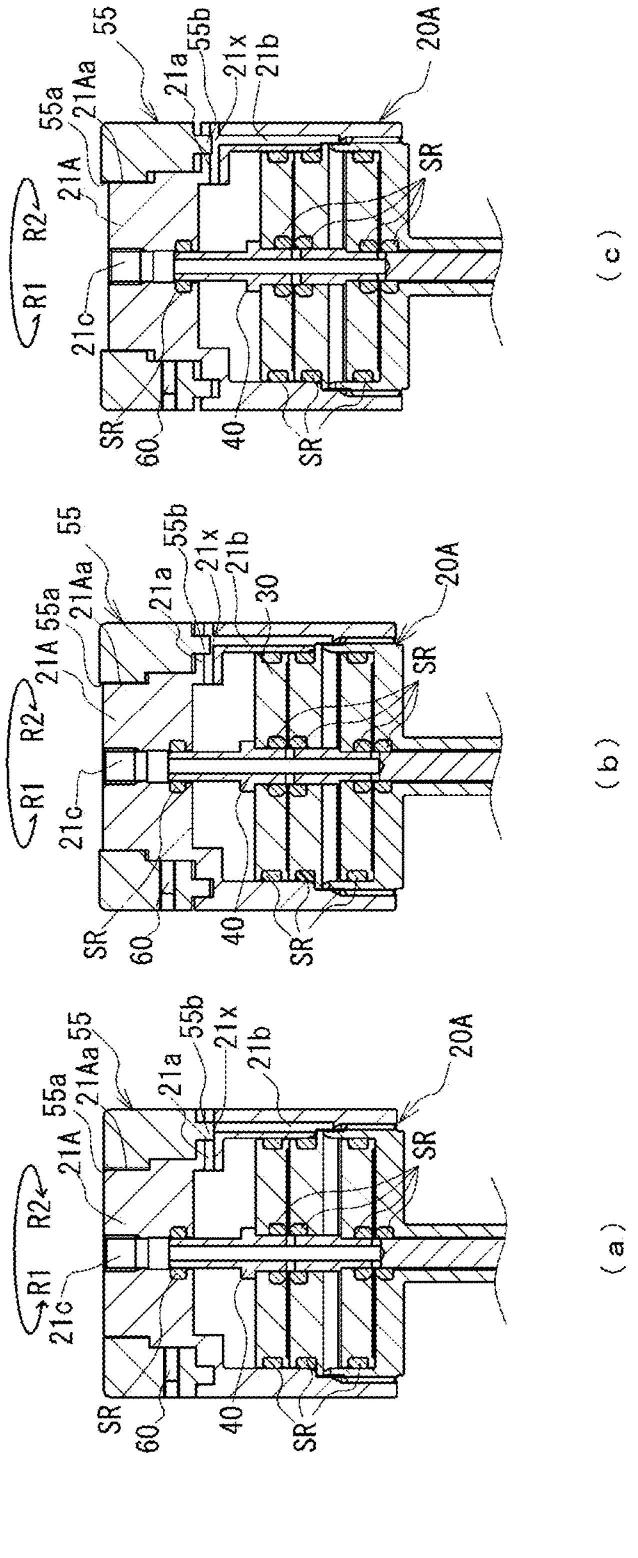

【fig.7】
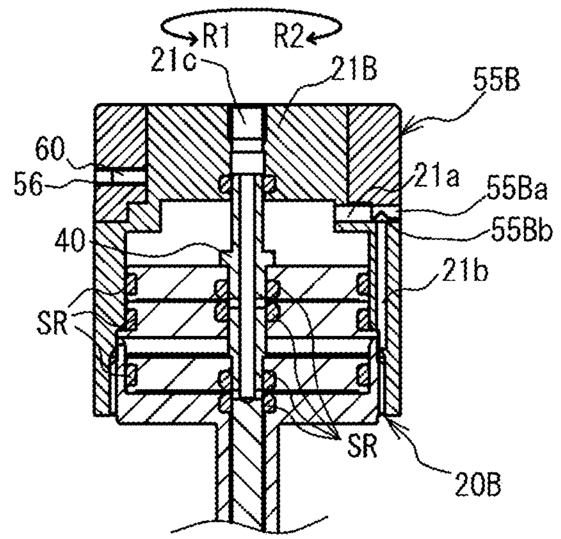
【fig.8A】
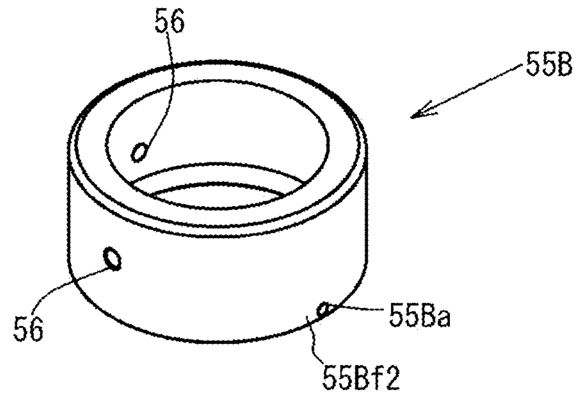

【fig.8B】
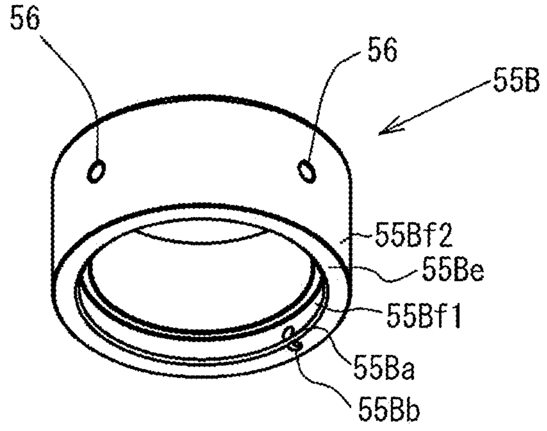

VALVE DEVICE

TECHNICAL FIELD

The present invention relates to a valve device as a fluid-control device used for, for example, controlling supply of process gas in semiconductor-processing.

BACKGROUND ART

In a film forming process for forming a thin film on a surface of a semiconductor wafer, miniaturization of the thin film is required, and in a recent semiconductor process, a film-forming process called an ALD (Atomic Layer Deposition) of forming a thin film at an atomic level or a molecular level is used.

In such a semiconductor process, in order to supply accurately measured process gas to a processing chamber, a process gas supplied from a gas box is temporarily stored in a tank as a buffer, and the process gas from the tank is supplied to a vacuum-atmosphere processing chamber by an open-close valve provided in the immediate vicinity of the processing chamber that is opened and closed at a high frequency. For the open-close valve provided in the immediate vicinity of the process chamber, see, for example, Patent Literature 1 and 2.

Patent Literature

PTL 1: Japanese Laid-Open Patent Application No. 2007-64333

PTL 2: Japanese Laid-Open Patent Application No. 2016-121776

SUMMARY OF INVENTION

Technical Problem

The open-close valve disclosed in Patent Literature 1 and 2 is a so-called normally-closed type open-close valve that is closed by a biasing force of a spring member acting at all times, and is opened against the biasing force of the spring member by supplying compressed air as a driving gas to the pressure chamber.

In a normally-closed open-close valve, it is known that the valve opening time and the valve closing time change depending on the pressure of the supplied driving gas. Here, the valve opening time is a time required from start of supply of the driving gas to the pressure chamber of open-close valve until completion of valve opening, and the valve closing time is a time from start of discharge of the driving gas accumulated in the pressure chamber until completion of valve closing by the biasing force of the spring member.

In order to control the flow rate of process gas with high precision, it is preferable that the valve opening time and the valve closing time in each open-close valve are as equal as possible and are adjustable.

However, since the valve opening time and the valve closing time depend on the set pressure of the driving gas used by the user, it is difficult to adjust the valve opening time and the valve closing time according to the requirements for each user.

Even if the set pressure of the driving gas is the same, the valve opening time and the valve closing time may differ depending on the machine difference between open-close valves. Since such difference may cause unevenness in the density of process gas supplied to the processing chamber, the valve opening times between open-close valves provided in the immediate vicinity of the processing chamber are required to be matched.

The present invention has been made in view of the above problems, and an object of the present invention is to provide a valve device with an adjustment mechanism that can adjust the valve opening time and the valve closing time in each open-close valve or the valve opening times in the plurality of open-close valves to be substantially coincide with each other.

Solution to Problem

The valve of the present invention comprises:

a valve body defining a flow path;

a valve element for opening and closing the flow path, a stem for making the valve element separate and seat in a valve seat provided in the valve body;

a spring member for constantly biasing the stem in a valve closing direction;

a piston coupled to the stem; and an actuator body for slidably accommodating the piston;

the actuator body having an inside partitioned by the piston into a pressure chamber to which a driving gas is supplied and an air chamber communicating with the atmosphere via a vent hole formed in the actuator body, the actuator body including an adjustment mechanism capable of restricting a ventilation amount of the vent hole.

The adjustment mechanism adjusts the valve closing time required for valve closing and the valve opening time required for valve opening so as to be substantially equal to each other.

In the above configuration, in a state before adjustment by the adjustment mechanism, a valve opening movement time, which is a movement time required for the piston to shift from a valve-closed state to a valve-open state, and a valve closing movement time, which is a movement time required for the piston to shift from the valve-open state to the valve-closed state, are different from each other. Further, the valve opening movement time is shorter than the valve closing movement time.

In the above configuration, the valve opening movement time and the valve closing movement time are each extended by restriction of the ventilation amount by the adjustment mechanism, and an extension amount of the valve opening movement time is larger than an extension amount of the valve closing movement time.

In the present invention, a valve opening movement start time, which is a time required from start of supply of the driving gas to the pressure chamber until a force of the driving gas acting on the piston exceeds a biasing force of the spring member to cause the piston to start the movement, and a valve closing movement start time, which is a time required from start of discharge of the driving gas in the pressure chamber until the biasing force of the spring member exceeds the force of the driving gas acting on the piston, are different from each other. Further, the valve opening movement start time is longer than the valve closing movement start time.

Preferably, the adjustment mechanism may have a cover member screwed to the actuator body so as to cover an upper outer periphery of the actuator body, and a part of the cover member may be used to adjustably restrict the ventilation amount of the vent hole.

More preferably, it is also possible to adopt a configuration in which the adjustment mechanism includes a cover member rotatably provided on the actuator body so as to cover an upper outer periphery of the actuator body, and the cover member is formed to be capable of adjusting the ventilation amount of the vent hole by adjusting a rotational position with respect to the actuator body.

Advantageous Effects of Invention

According to the present invention, there is provided a valve device with an adjustment mechanism so that it is possible to adjust the valve opening time and the valve closing time of each open-close valve or the valve opening times of a plurality of open-close valves to be substantially coincident with each other at the set pressure of the driving gases used.

BRIEF DESCRIPTION OF DRAWINGS

FIG. 1 is a longitudinal sectional view of a valve device according to an embodiment of the present invention.

FIG. 2 is a cross-sectional view showing an operation of an adjustment mechanism for restricting the amount of ventilation.

FIG. 3 is a graph showing a relationship between a force acting on the piston and an operation time when there is no restriction on the amount of ventilation.

FIG. 4 is a graph showing a relationship between a force acting on the piston and an operation time when the ventilation amount is restricted.

FIG. 5 is a graph showing a relationship between a force acting on the piston and an operation time when the ventilation amount is restricted and the restriction amount is adjusted.

FIG. 6 is a cross-sectional view showing another structural example of the adjustment mechanism of the present invention and its operation.

FIG. 7 is a sectional view showing still another structural example of the adjustment mechanism of the present invention.

FIG. 8A is an external perspective view from above of the cover member of FIG. 7.

FIG. 8B is an external perspective view from below of the cover member of FIG. 7.

DESCRIPTION OF EMBODIMENTS

Hereinafter, embodiments of the present invention will be described with reference to the drawings. In the description, the same elements are denoted by the same reference numerals, and redundant description will be omitted as appropriate.

FIG. 1 is a cross-sectional view illustrating a configuration of a valve device 1 in an open state according to an embodiment of the present invention. In FIG. 1, an arrow A1, A2 indicates a vertical direction, A1 indicates an upward direction, and A2 indicates a downward direction.

Valve device 1 includes a valve body 2, a valve seat 3, a diaphragm 4 as a valve element, a stem 7, a bonnet 10, a coil spring 15 as a spring member, and an actuator body 20.

The valve body 2 is formed into a block shape of a metal such as stainless steel, has a cylindrical portion 2*a* at an upper portion thereof, and a flow path 2*b* and a flow path 2*c* formed to allow a fluid such as process gas to flow therethrough. A flow path 2*b* is opened in a bottom surface of the cylindrical portion 2*a*, and a valve seat 3 made of a synthetic resin such as PFA, PA, PI, PCTFE, PTFE is provided around the opening of flow path 2*b*. The valve seat 3 is fixed to the valve body 2 by caulking, but may be disposed without caulking.

The diaphragm 4 is disposed at a bottom surface in the cylindrical portion 2*a* of the valve body 2 so as to face the valve seat 3. Specifically, the peripheral edge portion on the lower surface side of the diaphragm 4 is supported by a support portion formed of an annular projection formed on a bottom surface in the cylindrical portion 2*a* of the valve body 2, and the peripheral edge portion on an upper surface side of the diaphragm 4 is pressed downward A2 by an annular presser adapter 5, whereby the peripheral edge portion is fixed to the valve body 2 air-tightly. That is, the diaphragm 4 has a peripheral edge contacting the valve body 2 air-tightly so as to define a portion of flow path in cooperates with the valve body 2 to communicate flow path 2*b* and flow path 2*c*.

In the present embodiment, the diaphragm 4 has a spherical shell shape in which an upward convex circular arc shape is in a natural state by causing a central portion of a metal thin plate such as special stainless steel and a nickel-cobalt alloy thin plate to bulge upward. The diaphragm 4 is formed to be elastically deformable in a spherical shell shape by, for example, a metal such as a stainless-steel or NiCo alloy-based resin or a fluororesin. The diaphragm 4 moves between a valve closed position in which it is pressed against the valve seat 3 and a valve open position, that is, is separated and seated, thereby communicating and shutting off flow path 2*b* and flow path 2*c*.

Bonnet 10 is connected to the valve body 2 by being screwed into a screw portion formed on an inner peripheral surface of the cylindrical portion 2*a* of the valve body 2, whereby an annular-shaped lower end surface of bonnet 10 presses presser adapter 5 downward and the diaphragm 4 is fixed to the valve body 2.

The stem 7 holds a diaphragm presser 8 at its lower end and is connected at its upper end to the piston rod 40, and arranged so as to be movable in the vertical direction A1, A2 inside the bonnet 10. Diaphragm presser 8 has a convex curved surface that abuts the center of upper surface of the diaphragm 4, and is a member formed of a synthetic resin such as polyimide.

Coil spring 15 is provided so as to surround the stem 7, a lower end portion of coil spring 15 is received by a flanged portion 7*a* formed at a lower end portion of the stem 7, and an upper end portion of coil spring 15 is received by a ceiling surface inside bonnet 10. Coil spring 15 is compressed from its natural length and constantly urges the stem 7 downward toward the diaphragm 4.

The actuator body 20 includes a main body portion 21 and a lower lid portion 22, and a screw portion formed on the outer periphery of the lower lid portion 22 is screwed to a screw portion of the inner periphery of the main body portion 21 having a lower end opened.

A cylindrical portion 22*a* extending downward is formed in a central portion of the lower lid portion 22, and a screw portion formed on an outer periphery of the cylindrical portion 22*a* is screwed into a screw hole formed in a central portion of an upper end portion of bonnet 10, whereby the actuator body 20 is connected to bonnet 10. The position of the actuator body 20 with respect to bonnet 10 is locked by a lock nut 11 which is screwed into the cylindrical portion 22*a* of the lower lid portion 22 and abuts against the upper end surface of bonnet 10. The position of the actuator body 20 relative to bonnet 10 defines the position of the stem 7 when the valve is fully open.

The inside of the actuator body 20 is partitioned into upper and lower spaces by a partition member 35 which is slidably penetrated by a piston rod 40, and a piston 30 which engages with the piston rod 40 is provided in the upper space so as to be slidable in the vertical direction. A piston 36 that engages with the piston rod 40 is provided in the lower space so as to be slidable in the vertical direction. In FIG. 1, SR indicates a seal member such as an O-ring.

The piston 30 partitions an upper space of the actuator body 20 into a pressure chamber 31 and an atmospheric chamber 32, and the piston 36 partitions a lower space of the actuator body 20 into a pressure chamber 37 and an atmospheric chamber 38.

The pressure chamber 31 communicates with a flow passage 41 formed in a central portion of the piston rod 40 via a branch passage 41*a*, and the pressure chamber 37 communicates with a flow passage 41 formed in a central portion of the piston rod 40 via a branch passage 41*b*. The opening at an upper end side of the flow passage 41 of the piston rod 40 communicates with a supply passage 21*c* formed at an upper center portion of the main body portion 21 of the actuator body 20. The driving gas DG supplied through the supply passage 21*c* is supplied to the pressure chamber 31 and the pressure chamber 37.

The atmospheric chamber 32 communicates with the atmosphere through a vent hole 21*a* formed in an upper portion of the main body portion 21 of the actuator body 20.

The atmospheric chamber 38 communicates with the atmosphere through a cylindrical part of the main body portion 21 of the actuator body 20 and a vent hole 21*b* formed in the upper part.

A three-way valve 100 is constituted by a solenoid valve, and when a control signal SG is turned on, a valve (not shown) for supplying a driving gas DG is opened to supply a driving gas DG having a predetermined pressure to the pressure chambers 31 and 37, and the pressure inside the pressure chambers 31 and 37 is maintained at a predetermined pressure. When the control signal SG is turned off, the valve for supplying the driving gas DG is closed, and the supply passage 21*c* is opened to the atmosphere as indicated by a dotted line in FIG. 1, and the driving gas DG accumulated in the pressure chambers 31 and 37 is discharged to the outside.

An adjustment mechanism 50 is provided in the middle of the vent hole 21*a* and the vent hole 21*b*, and is provided to adjustably restrict the ventilation amount of the air discharged from the atmospheric chamber 32 and the atmospheric chamber 38 to the outside through the vent hole 21*a* and the vent hole 21*b*, or the ventilation amount of the air sucked into the atmospheric chamber 32 and the atmospheric chamber 38 through the vent hole 21*a* and the vent hole 21*b*. The adjustment mechanism 50 can adjust the amount of ventilation by narrowing the cross-sectional area through which the air can pass, in a part of the vent hole 21*a* and the vent hole 21*b*.

Specifically, a screw hole is formed so as to cross the vent hole 21*a* and 21*b* in the radial direction of the main body portion 21 of the actuator body 20, and the ventilation amount is adjusted by the screw member 51 screwed to screw hole.

The screw member 51 has a pin portion 51*a* in which no screw is formed in a tip end portion, and a groove portion 51*b* formed in the middle of the screw member 51.

FIG. 2 shows an example of the restriction of the ventilation amount by the adjustment mechanism 50, where (a) shows a case where the restriction amount of the ventilation amount is relatively large, (b) shows a case where the restriction amount is middle, and (c) shows a case where the restriction amount of the ventilation amount is relatively small. As shown in (a), when the pin portion 51*a* enters the vent hole 21*a* largely and the groove portion 51*b* is positioned outside the vent hole 21*b*, the restriction of the vent volume is large. On the other hand, as shown in (c), when the pin portion 51*a* is retracted from the vent hole 21*a* and the groove portion 51*b* is positioned in the vent hole 21*b*, the amount of restriction of the amount of ventilation is small. (b) is an intermediate state between (a) and (c). In this way, by adjusting the position of the screw member 51, it is possible to arbitrarily adjust the restriction amount of the ventilation amount. A lock nut 52 is provided to lock the adjusted position of the screw member 51.

Next, the basic operation of valve device 1 will be described.

When the driving gas DG is not supplied to the actuator body 20 through the supply passage 21*c*, the force of coil spring 15 urges the stem 7 in the downward direction A2, and the diaphragm 4 is pressed by the diaphragm presser 8 and pressed against the valve seat 3, thereby shutting off flow path 2*b* and flow path 2*c*. This state is a valve closed state.

When a control signal SG to the three-way valve 100 is turned on, the driving gas DG is supplied to the pressure chambers 31 and 37 through the supply passage 21*c* and the flow passage 41, whereby the pistons 30 and 36 are pushed up in the upward direction A1 against the force of coil spring 15. Air is discharged from the atmospheric chambers 32 and 38 to the outside through the vent hole 21*a*, 21*b*. When the stem 7 moves in the upward direction A1 together with the pistons 30 and 36, the diaphragm 4 is separated from the valve seat 3, and flow path 2*b* and flow path 2*c* communicate with each other. Movement of the stem 7 is restricted at a position where the upper end surface 7*b* of the stem 7 moving in the upward direction A1 abuts against the lower end surface 22*b* of the cylindrical portion 22*a* of the actuator body 20. The position where the movement of the stem 7 in the upward direction A1 is restricted is a position where the valve is opened.

When the control signal SG for the three-way valve 100 is turned off, the supply of the driving gas DG is cut off in the three-way valve 100, the supply passage 21*c* is opened to the atmosphere, and the driving gas DG accumulated in the pressure chambers 31 and 37 is discharged to the outside through the supply passage 21*c*. When the pressure in the pressure chambers 31 and 37 decreases, while the pistons 30 and 36 are depressed in the downward direction A2 by the force of coil spring 15, the external air flows into the atmospheric chambers 32 and 38 through the vent holes 21*a*, 21*b*, and finally, the diaphragm 4 is pressed against the valve seat 3 to close the valve.

Next, a method of adjusting the valve closing time and the valve opening time by the adjustment mechanism 50 will be described.

Here, the valve opening time is defined as the time required from the valve closed state in which the diaphragm 4 of the valve device 1 is pressed against the valve seat 3 by a biasing force of coil spring 15 to shut off the gap between flow path 2*b* and flow path 2*c* to the valve open state in which the control signal SG for the three-way valve 100 is turned on and the driving gas DG having a predetermined set pressure is supplied to the pressure chambers 31 and 37, the piston 30 and the piston 36 are raised against the biasing force of coil spring 15, and the stem 7 is raised to the predetermined position to bring the valve in an open state in which flow path 2*b* and flow path 2*c* communicate with each other.

Further, the valve closing time is a time required from the valve open state, the control signal SG for the three-way valve 100 is turned off, the valve for supplying the driving gas DG in the three-way valve 100 is shut off, and the supply passage 21*c* is opened to the atmosphere, whereby the driving gas DG accumulated in the pressure chambers 31 and 37 is discharged to the outside, the pressure in the pressure chambers 31 and 37 is lowered, and the diaphragm 4 of valve device 1 is pressed against the valve seat 3 by the biasing force of coil spring 15 to bring the valve in a closed state.

The valve opening time and the valve closing time are measured based on, for example, a control signal SG and a signal from a position detector provided in the valve device 1.

FIG. 3 is a diagram schematically illustrating an exemplary relation between a force acting on the piston and time in valve device 1 in which no adjustment is made by the adjustment mechanism 50. In FIG. 3, the force is shown as negative when the force acts in the downward direction A2, and shown as positive when the force acts in the upward direction A1. Since each numerical value is used for simplification of explanation, it is different from the actual numerical value.

Graph N1 shows a relation between the force and time when shifting from the valve-closed state to the valve-open state, and graph N2 shows the relation between the force and time when shifting from the valve-open state to the valve-closed state.

In the graph N1, since coil spring 15 is initially assembled in a retracted state from its natural length, a force of 600 N acts on the pistons 30, 36 in the downward direction A2 from the coil spring 15.

When the driving gas DG is introduced into the actuator body 20, the internal pressure of the pressure chambers 31 and 37 gradually increases, and the force in the direction of pushing up the pistons 30 and 36 in the upward direction A1 increases. When a time of T1*a* elapses from turn on of SG, the biasing force of coil spring 15 and the force of the driving gas DG are balanced, and thereafter, the force from the driving gas DG exceeds the biasing force of coil spring 15, and the pistons 30 and 36 begin to move in the upward direction A1. Hereinafter, a time of T1*a* is referred to as a valve opening movement starting time.

After the valve opening movement start time T1*a* has elapsed, the pistons 30 and 36 move in the upward direction A1 while the coil spring 15 contracts. Air in the atmospheric chambers 32 and 38 is discharged to the outside through the vent holes 21*a*, 21*b*. At this time, since the coil spring 15 contracts, the reaction force toward the downward direction A2 of coil spring 15 increases, so that the amount of increase in the force acting on the pistons 30 and 36 decreases, and the slope of the graph N1 decreases.

When the pistons 30, 36 reach a predetermined position, the pistons 30, 36 stop. Here, the time from start of movement of the pistons 30 and 36 until they stop is referred to as a valve opening movement time T1*b*.

In the graph N2, when the control signal SG is turned off and the driving gas DG accumulated in the pressure chambers 31 and 37 is released and the pressure decreases, the force in upward direction A1 acting on the pistons 30 and 36 gradually decreases. After a time of T2*a*, the force of coil spring 15 and the force from the driving gas DG are balanced, and then the force of coil spring 15 exceeds the force from the driving gas DG, so that the pistons 30 and 36 begin to move in the downward direction A2. This time of T2*a* is referred to as a valve closing movement start time T2*a*. As the coil spring 15 expands and the reaction force of coil spring 15 gradually decreases after the force of coil spring 15 and the force from the driving gas DG are balanced, the increment of the force becomes smaller and the slope of the graph N2 becomes smaller. When the pistons 30, 36 reach a predetermined position, the pistons 30, 36 stop. Here, the time from start of movement of the pistons 30 and 36 until they stop is referred to as a valve closing movement time T2*b*.

Comparing the graph N1 and the graph N2, it can be seen that the valve opening time T1 and the valve closing time T2 are different. Further, it can be seen that the valve opening movement start time T1*a* and the valve closing movement start time T2*a* are different, and the valve opening movement start time T1*a* is longer than the valve closing movement start time T2*a*. Furthermore, it can be seen that the valve opening movement time T1*b* is different from the valve closing movement time T2*b*, and that the valve opening movement time T1*b* is shorter. That is, it can be seen that the movement times of the pistons 30 and 36 are different between the transition from the valve-closed state to the valve-open state and the transition from the valve-open state to the valve-closed state.

This difference is considered to be due to the fact that the stiffness of coil spring 15 and the set pressure of the driving gas DG are designed so that the magnitude of the force acting on the pistons 30 and 36 differs between initial states at the time of shifting from the valve open state to the valve closed state and at the time of shifting from the valve closed state to the valve open state.

FIG. 4 is a diagram schematically illustrating an exemplary relation between a force acting on the piston in valve device 1 and the time, when the ventilations of the vent holes 21*a*, 21*b* are restricted by the adjustment mechanism 50.

Graph K1 shows a relationship between the force and time when shifting from the valve-closed state to the valve-open state, and graph K2 shows a relationship between the force and time when shifting from the valve-open state to the valve-closed state. In order to compare with the case where the ventilations through the vent holes 21*a*, 21*b* are not restricted, the graphs N1 and N2 described above are also shown in FIG. 4. The set pressure of the driving gas DG used is also the same as in FIG. 3.

In the graph K1, the valve opening movement start time T1*a* is exactly the same as the valve opening movement start time T1*a* of the graph N1. In the graph K1, as in the graph N1, the pistons 30 and 36 begin to move in the upward direction A1 at a stage where the force in the upward direction A1 and the force in the downward direction A2 are balanced, but by restricting the ventilation volumes of the vent holes 21*a*, 21*b* to some extent, the air in the atmospheric chambers 32 and 38 is less likely to be discharged to the outside through the vent holes 21*a*, 21*b*, and this acts on the pistons 30 and 36 as a resistive force. As a consequence, the valve opening movement time T1*b* is extended compared to the graph N1. This extension is referred to as Ex1. When the valve opening movement time T1*b* is extended, the valve opening time T1 is also extended.

In the graph K2, the valve closing movement start time T2*a* is exactly the same as the valve closing movement start time T2*a* of the graph N2. In the graph K2, as in the graph N2, the pistons 30 and 36 begin to move in the downward direction A2 at a stage where the force in the upward direction A1 and the force in the downward direction A2 are balanced, but by restricting the ventilation volumes of the vent holes 21*a*, 21*b* to some extent, the external air is less likely to be sucked into the atmospheric chambers 32 and 38 through the vent holes 21*a*, 21*b*, and this acts on the pistons 30 and 36 as a resistive force. As a consequence, the valve closing movement time T2*b* is extended as compared with the case of the graph N2. This extension is referred to as Ex2. When the valve closing movement time T2*b* is extended, the valve closing time T2 is also extended.

When the ventilation amounts of the vent holes 21*a*, 21*b* are restricted, both the valve opening time T1 and the valve closing time T2 are extended, but it is important that the extension amount Ex1 of the valve opening movement time T1*b* and the extension amount Ex2 of the valve closing movement time T2*b* are different from each other, and the extension amount Ex1 is newly found to be larger than the extension amount Ex2.

Due to the restriction of ventilation amount by the adjustment mechanism 50, it is considered that the total amount of the resistive force received by the pistons 30 and 36 does not change in any of the operations at the time of valve opening and at the time of valve closing. However, it is considered that the magnitude of the resistive force per unit time due to the restriction of ventilation amount received by the pistons 30 and 36 becomes larger as the moving time of the pistons 30 and 36 becomes shorter, and the influence on the extension of the moving time of the pistons 30 and 36 becomes larger. That is, the restriction of ventilation amount by the adjustment mechanism 50 has a greater effect on the extension of the valve opening movement time T1*b* as compared with the valve closing movement time T2*b*. This is considered to be the reason why the extension amount Ex1 of the valve opening movement time T1*b* is longer than the extension amount Ex2 of the valve closing movement time T2*b*.

The method of adjusting the valve opening time T1 and the valve closing time T2 by the adjustment mechanism 50 of this embodiment is to adjust the valve opening time T1 and the valve closing time T2 which are different from each other so as to be close to each other by using the phenomena in which the extension amount Ex1 of the valve opening movement time T1*b* is larger than the extension amount Ex2 of the valve closing movement time T2*b*.

That is, if the restriction amount of the ventilation amount of the adjustment mechanism 50 is adjusted and the extension amount Ex1 and the extension amount Ex2 are appropriately changed, the valve opening time T1 and the valve closing time T2 can be adjusted substantially the same, for example, as shown in the graphs K1A, K2A of FIG. 5. Graph K1A shows the relation between the force and a time in a case of shifting from the valve closed state to the valve open state when the restriction amount of the ventilation amount is adjusted, and the graph K2A shows the relation between the force and time in a case of shifting from the valve open state to the valve closed state when the restriction amount of the ventilation amount is adjusted.

Specifically, when they are adjusted in a direction in which the extension amount Ex1 and the extension amount Ex2 become smaller, that is, in a direction in which the restriction amounts of vent holes 21*a*, 21*b* are reduced from the state illustrated in FIG. 4, it is possible to find the restriction amounts of the vent holes 21*a*, 21*b* in which the valve opening time T1 and the valve closing time T2 becomes substantially equal to each other as illustrated in FIG. 5.

As described above, according to this embodiment, when the ventilation amounts of the vent holes 21*a*, 21*b* of the actuator body 20 are not restricted, and when the valve opening time T1 and the valve closing time T2 differ from each other, for example as shown in FIG. 3, under the set pressure of the driving gas DG to be used, the valve opening time T1 and the valve closing time T2 can be substantially matched by adjusting the ventilation amounts of the vent holes 21*a*, 21*b* using the adjustment mechanism 50.

FIG. 6 shows a modification of the adjustment mechanism. In FIG. 6, the same reference numerals are used for the same components as those in the above-described embodiment. Note that (a) of FIG. 6 shows a case where the restriction amount of the ventilation amount is relatively large, (b) shows a case where the restriction amount of the ventilation amount is intermediate, and (c) shows a case where the restriction amount of the ventilation amount is relatively small.

In the actuator body 20A shown in FIG. 6, an outer diameter of an upper portion of the main body portion 21A is smaller than a diameter of a lower end portion thereof, and a screw portion 21Aa is formed on an outer peripheral surface of the reduced diameter portion of the main body portion 21A. The cover member 55 formed in a cylindrical shape is provided so as to cover the upper outer periphery of the actuator body 20A. A screw portion 55*a* is formed on the inner peripheral surface of the cover member 55, and screw portion 55*a* is screwed to the screw portion 21Aa of the main body portion 21A. The cover member 55 is rotatable in the rotational direction R1 and the rotational direction R2, and the cover member 55 is moved upward with respect to the actuator body 20A by rotating in one of the rotational direction R1 and the rotational direction R2, and the cover member 55 is moved downward with respect to the actuator body 20A by rotating in the other of the rotational direction R1 and the rotational direction R2.

The cover member 55 is formed so that its outer diameter is substantially the same as the outer diameter of the lower part of the main body portion 21A, and there is no protrusion on the outer peripheral surface of the actuator body 20A.

The main body portion 21A includes a vent hole 21*a* and a vent hole 21*b* that are joined at an upper end thereof and open at an outer surface of the main body portion 21A.

The annular protruding portion 55*b* formed at the lower end portion of the cover member 55 is arranged so as to face the merging portion 21*x* of the vent hole 21*a* and the vent hole 21*b*. As illustrated in (a) to (c) of FIG. 6, when the protruding portion 55*b* approaches the merging portion 21*x*, the restriction amount of the ventilation amount increases, and as the protruding portion 55*b* moves away from the merging portion 21*x*, the restriction amount of the ventilation amount decreases. Therefore, by adjusting the amount of rotation of the cover member 55, it is possible to arbitrarily adjust the restriction amount of the ventilation amount. The adjusted position of the cover member 55 can be fixed by a lock screw 60 provided on the cover member 55.

FIG. 7 shows still another modification of the adjustment mechanism. In FIG. 7, the same reference numerals are used for the same components as those in the above-described embodiment.

In the actuator body 20B shown in FIG. 7, no screw portion is formed on the upper portion of the main body portion 21B. An annular-shaped cover member 55B is fitted to the outer peripheral portion so as to cover the outer peripheral portion.

The cover member 55B is rotatable with respect to the main body portion 21B of the actuator body 20B in the rotational direction R1 and the rotational direction R2, but the cover member 55B does not move up and down with respect to the actuator body 20B even when it is rotated.

In the cover member 55B, as shown in FIGS. 8A and 8B, there are formed a vent hole 55Ba which extends in a radial direction, opens on the inner peripheral surface 55Bf1 of the lower end side and opens on the outer peripheral surface 55Bf2, and a vent hole 55Bb which opens at the lower end surface 55Be and merges in the middle of the vent hole 55Ba. In addition, a screw hole 56 into which the lock screw 60 is screwed is formed at a plurality of positions in the cover member 55B.

The vent hole 55Ba and the vent hole 55Bb correspond to the vent hole 21*a* and the vent hole 21*b*, and by rotating the cover member 55B and thereby adjusting the degree of overlap between the vent hole 55Ba and the vent hole 21*a* and between the vent hole 55Bb and the vent hole 21*b*, it is possible to adjust the ventilation amount between the vent hole 21*a* and the vent hole 21*b*. When the degree of overlap between the vent hole 55Ba and the vent hole 21*a* and between the vent hole 55Bb and the vent hole 21*b* is maximized, the vent amount is maximized, and as the degree of overlap decreases, the vent hole 21*a* and the vent hole 21*b* are blocked by the inner peripheral surface 55Bf1 and the lower end surface 55Be, respectively, so that the vent amount also decreases. Accordingly, by adjusting the rotational position of the cover member 55B with respect to the actuator body 20B, the ventilation amounts of the vent hole 21*a* and the vent hole 21*b* can be adjusted.

The cover member 55B of FIG. 7 does not move up and down even if it is rotated with respect to the main body portion 21A, and thus there is an advantage that a step does not occur in the actuator body 20B.

A plurality of the vent holes 21*a* and the vent holes 21*b* may be present, and in such cases, in accordance with their numbers, the numbers of the vent holes 55Ba, 55Bb of the cover member 55B may be increased.

In the above embodiment, a metallic diaphragm is used as the valve element, but the present invention is not limited thereto, and a valve element directly connected to tip end portion of the stem may be used.

In the above-described embodiment, a valve capable of adjusting the position of the actuator body and adjusting the flow rate of flow path is used, but the present invention is not limited thereto, and the actuator body and the bonnet may be integrated, or a valve in which the actuator body is directly fixed to the valve body by a bonnet may be used.

In the above embodiment, compressed air is used as the driving gas DG, but other gases may be used.

Although the embodiments of the present invention have been described in detail above, the present invention is not limited to such particular embodiments, and various modifications and changes can be made within the scope of the gist of the present invention described in claims.

REFERENCE SIGNS LIST

1: Valve device
2: Valve body
2*a*: Cylindrical portion
2*b*, 2*c*: Flow path
3: Valve seat
4: Diaphragm
5: Presser adapter
7: Stem
7*a*: Flange
7*b*: Upper end surface
8: Diaphragm presser

10: Bonnet
11: Lock nut
15: Coil spring
20, 20A, 20B: Actuator body
21, 21A, 21B: Main body portion
21Aa: Screw portion
21*a*, 21*b*: Vent hole
21*c*: Supply passage
21*x*: Merging portion
22: Lower lid portion
22*a*: Cylindrical portion
22*b*: Lower end surface
30: Piston
31, 37: Pressure chamber
32, 38: Atmospheric chamber
35: Partition member
36: Piston
40: Piston rod
41: Flow passage
41*a*, 41*b*: Branch passage
50: Adjustment mechanism
51: Screw member
51*a*: Pin
51*b*: Groove
55, 55B: Cover member
55Ba, 55Bb: Vent hole
55Be: Lower end surface
55Bf1: Inner peripheral surface
55Bf2: Outer peripheral surface
55*a*: Screw portion
55*b*: Protruding portion
56: Screw hole
60: Lock screw
100: Three-way valve
A1: Upward direction
A2: Downward direction
DG: Driving gas
Ex1, Ex2: Extension amount
K1, K1A, K2, K2A, N1, N2: Graph
R1, R2: Rotational direction
SG: Control signal
T1: Valve opening time
T1*a*: Valve opening movement start time
T1*b*: Valve opening movement time
T2: Valve closing time
T2*a*: Valve closing movement start time
T2*b*: Valve closing movement time

What is claimed is:

1. A valve device comprising:
a valve body defining a flow path;
a valve element for opening and closing the flow path;
a stem for making the valve element separate and seat in a valve seat provided in the valve body;
a spring member for constantly biasing the stem in a valve closing direction;
a piston coupled to the stem; and
an actuator body for slidably accommodating the piston;
the actuator body having an inside partitioned by the piston into a pressure chamber to which a driving gas is supplied and an air chamber communicating with the atmosphere via a vent hole formed in the actuator body,
the actuator body including an adjuster capable of restricting a ventilation amount of the vent hole.

2. The valve device according to claim 1, wherein the adjuster adjusts a valve closing time required for valve closing and a valve opening time required for valve opening so as to be substantially equal to each other.

3. The valve device according to claim 2, wherein in a state prior to adjustment by the adjuster, a valve opening movement time, which is a movement time required for the piston to shift from a valve-closed state to a valve-open state, and a valve closing movement time, which is a movement time required for the piston to shift from the valve-open state to the valve-closed state, are different from each other.

4. The valve device according to claim 3, wherein the valve opening movement time is shorter than the valve closing movement time.

5. The valve device according to claim 4, wherein the valve opening movement time and the valve closing movement time are each extended by restricting the ventilation amount by the adjuster, and an extension amount of the valve opening movement time is larger than an extension amount of the valve closing movement time.

6. The valve device according to claim 1, wherein a valve opening movement start time, which is a time required from start of supply of the driving gas to the pressure chamber until a force of the driving gas acting on the piston exceeds a biasing force of the spring member to cause the piston to start movement, and a valve closing movement start time, which is a time required from start of discharge of the driving gas in the pressure chamber until the biasing force of the spring member exceeds the force of the driving gas acting on the piston, are different from each other.

7. The valve device according to claim 6, wherein the valve opening movement start time is longer than the valve closing movement start time.

8. The valve device according to claim 1, wherein the adjuster includes a cover member screwed to the actuator body so as to cover an upper outer periphery of the actuator body, and a part of the cover member is used to adjustably restrict the ventilation amount of the vent hole.

9. The valve device according to claim 1, wherein the adjuster includes a cover member rotatably provided on the actuator body so as to cover an upper outer periphery of the actuator body, the cover member is formed to be capable of adjusting a ventilation amount of the vent hole by adjusting a rotational position with respect to the actuator body.

* * * * *